United States Patent
Saijo et al.

(10) Patent No.: US 10,243,536 B2
(45) Date of Patent: Mar. 26, 2019

(54) ELASTIC WAVE DEVICE AND MANUFACTURING METHOD THEREOF

(71) Applicant: Murata Manufacturing Co., Ltd., Nagaokakyo-shi, Kyoto-fu (JP)

(72) Inventors: Shin Saijo, Nagaokakyo (JP); Hisashi Yamazaki, Nagaokakyo (JP); Koji Yamamoto, Nagaokakyo (JP); Seiji Kai, Nagaokakyo (JP); Munehisa Watanabe, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 362 days.

(21) Appl. No.: 15/180,234

(22) Filed: Jun. 13, 2016

(65) Prior Publication Data

US 2016/0294354 A1  Oct. 6, 2016

(30) Foreign Application Priority Data

Dec. 27, 2013 (JP) .................. 2013-272567
Sep. 19, 2014 (JP) .................. 2014-191051

(51) Int. Cl.
 *H03H 9/145* (2006.01)
 *H03H 3/08* (2006.01)
 (Continued)

(52) U.S. Cl.
 CPC .......... *H03H 9/14544* (2013.01); *H03H 3/08* (2013.01); *H03H 9/02574* (2013.01);
 (Continued)

(58) Field of Classification Search
 CPC ............. H03H 9/14544; H03H 9/0514; H03H 9/0561; H03H 9/145; H03H 3/08
 See application file for complete search history.

(56) References Cited

U.S. PATENT DOCUMENTS

| 4,890,369 A | * | 1/1990 | Tanski ...................... H03H 3/08 216/59 |
| 2005/0001512 A1 | | 1/2005 | Noguchi et al. |

(Continued)

FOREIGN PATENT DOCUMENTS

| JP | 2002-76830 A | 3/2002 |
| JP | 2004-336600 A | 11/2004 |

(Continued)

OTHER PUBLICATIONS

English Translation of JP 2006121356.*

(Continued)

*Primary Examiner* — Bryan P Gordon
(74) *Attorney, Agent, or Firm* — Keating & Bennett, LLP

(57) ABSTRACT

In an elastic wave device, a multilayer film including a piezoelectric thin film is provided on a support substrate, an interdigital transducer electrode is provided on one surface of the piezoelectric thin film, a wiring electrode is connected to the interdigital transducer electrode, the wiring electrode includes a lead electrode portion and a pad electrode portion, an external connection terminal is located above the pad electrode portion, the external connection terminal is electrically connected to the pad electrode portion, and the external connection terminal is bonded onto the pad electrode portion on the support substrate so that at least the piezoelectric thin film of the multilayer film is not present below the pad electrode portion.

21 Claims, 12 Drawing Sheets

(51) Int. Cl.
  *H03H 9/10*  (2006.01)
  *H03H 9/02*  (2006.01)
  *H03H 9/05*  (2006.01)
  *H03H 9/13*  (2006.01)

(52) U.S. Cl.
  CPC ...... *H03H 9/02992* (2013.01); *H03H 9/0514* (2013.01); *H03H 9/0542* (2013.01); *H03H 9/0552* (2013.01); *H03H 9/1014* (2013.01); *H03H 9/1071* (2013.01); *H03H 9/132* (2013.01); *H03H 9/145* (2013.01)

(56) References Cited

U.S. PATENT DOCUMENTS

| | | | | |
|---|---|---|---|---|
| 2005/0200234 | A1* | 9/2005 | Sobu | H03H 3/08 310/313 R |
| 2005/0285699 | A1* | 12/2005 | Yokota | H03H 3/08 333/133 |
| 2007/0075606 | A1* | 4/2007 | Inoue | H03H 3/08 310/313 R |
| 2007/0096605 | A1 | 5/2007 | Fujii et al. | |
| 2008/0258844 | A1* | 10/2008 | Kadota | H03H 3/08 333/193 |
| 2010/0038992 | A1 | 2/2010 | Moriya et al. | |
| 2010/0225202 | A1* | 9/2010 | Fukano | H03H 9/059 310/313 C |
| 2010/0237963 | A1 | 9/2010 | Takamine | |
| 2011/0090651 | A1* | 4/2011 | Jung | H03H 9/0514 361/748 |
| 2012/0098387 | A1 | 4/2012 | Iwamoto et al. | |
| 2013/0285768 | A1 | 10/2013 | Watanabe et al. | |
| 2014/0003017 | A1 | 1/2014 | Kai et al. | |
| 2014/0009036 | A1 | 1/2014 | Iwamoto | |
| 2014/0339956 | A1* | 11/2014 | Kanae | H03H 9/1071 310/311 |

FOREIGN PATENT DOCUMENTS

| | | |
|---|---|---|
| JP | 2005-210475 A | 8/2005 |
| JP | 2005-295363 A | 10/2005 |
| JP | 2006-121356 A | 5/2006 |
| JP | 2006-303763 A | 11/2006 |
| JP | 2007-036656 A | 2/2007 |
| JP | 2007-60465 A | 3/2007 |
| JP | 2008-113178 A | 5/2008 |
| JP | 2009-188844 A | 8/2009 |
| JP | 2010-88132 A | 4/2010 |
| JP | 2010-178013 A | 8/2010 |
| JP | 2010-200197 A | 9/2010 |
| JP | 2010-278972 A | 12/2010 |
| JP | 2013-021387 A | 1/2013 |
| WO | 2005/050836 A1 | 6/2005 |
| WO | 2006/001125 A1 | 1/2006 |
| WO | 2009/075088 A1 | 6/2009 |
| WO | 2011/004665 A1 | 1/2011 |
| WO | 2012/086639 A1 | 6/2012 |
| WO | 2012/124648 A1 | 9/2012 |
| WO | 2012/132147 A1 | 10/2012 |

OTHER PUBLICATIONS

Official Communication issued in International Application PCT/JP2014/083514, dated Feb. 17, 2015.
Official Communication issued in Japanese Patent Application No. 2015-554795, dated Jan. 15, 2018.
Official Communication issued in corresponding Japanese Patent Application No. 2015-554795, dated Jun. 13, 2017.

* cited by examiner

ELASTIC WAVE DEVICE AND MANUFACTURING METHOD THEREOF

CROSS REFERENCE TO RELATED APPLICATIONS

This application claims the benefit of priority to Japanese Patent Application 2014-191051 filed Sep. 19, 2014, Japanese Patent Application 2013-272567 filed Dec. 27, 2013, and is a Continuation Application of PCT/JP2014/083514 filed on Dec. 18, 2014. The entire contents of each application are hereby incorporated by reference.

BACKGROUND OF THE INVENTION

1. Field of the Invention

The present invention relates to an elastic wave device in which a multilayer film including a piezoelectric thin film is laminated onto a support substrate, and relates to a manufacturing method thereof.

2. Description of the Related Art

Elastic wave devices are widely used in band-pass filters, resonators, and the like. WO 2012/124648 discloses an elastic wave device that uses a piezoelectric single-crystal thin film.

In WO 2012/124648, a high acoustic velocity film, a low acoustic velocity film, and the piezoelectric single-crystal thin film are laminated onto a support substrate in that order from the bottom. An interdigital transducer electrode and a pad electrode electrically connected to the interdigital transducer electrode are formed on the piezoelectric single-crystal thin film. A bump for making an electrical connection to the exterior is bonded onto the pad electrode.

Meanwhile, in an elastic wave device disclosed in WO 2009/075088, an interdigital transducer electrode is formed upon a piezoelectric substrate. A support frame is formed so as to surround the interdigital transducer electrode. A cover member is laminated so as to close off an opening in the upper surface of the support frame. A pad electrode is formed so as to be electrically connected to the interdigital transducer electrode. An under-bump metal layer is formed so as to pass through the support frame and the cover member. The under-bump metal layer is electrically connected to a pad electrode located therebelow. A metal bump is bonded to an upper surface of the under-bump metal layer.

With an elastic wave device that uses a piezoelectric single-crystal thin film such as that disclosed in WO 2012/124648, the piezoelectric single-crystal thin film is thin and can therefore break easily. On the other hand, the metal bump is bonded directly or indirectly onto the pad electrode from above as an external connection terminal. A high pressure is applied to the pad electrode during this bonding. Furthermore, when the elastic wave device is mounted onto a circuit board, the elastic wave device is pressed onto the circuit board from the side where the metal bump is located. There has thus been a problem in that when bonding the bump, during mounting onto the circuit board, or the like, it is easy for the piezoelectric single-crystal thin film to break below the pad electrode, easy for the laminated structure including the piezoelectric single-crystal thin film to peel away, and so on.

Meanwhile, in the case where a piezoelectric single-crystal thin film structure such as that disclosed in WO 2012/124648 is applied in a structure such as that disclosed in WO 2009/075088, a support layer, a cover layer, or the like may contract due to thermal processing or the like during mounting, causing a large amount of stress to act on the piezoelectric single-crystal thin film through the pad electrode. As a result, this structure has also had a problem in that it is easy for the piezoelectric single-crystal thin film to break, easy for the laminated structure including the piezoelectric single-crystal thin film to peel away, and so on.

SUMMARY OF THE INVENTION

Preferred embodiments of the present invention provide an elastic wave device in which a piezoelectric thin film does not easily peel away or break, and a method for manufacturing the same.

An elastic wave device according to a preferred embodiment of the present invention includes a support substrate; a multilayer film provided on the support substrate and includes a plurality of films including a piezoelectric thin film; an interdigital transducer electrode provided on one surface of the piezoelectric thin film; a wiring electrode including a lead electrode portion that is located on the multilayer film and is electrically connected to the interdigital transducer electrode, and a pad electrode portion that is continuous with the lead electrode portion; and an external connection terminal positioned above the pad electrode portion of the wiring electrode and connected to the pad electrode portion. Here, the external connection terminal is bonded onto the pad electrode portion on the support substrate so that at least the piezoelectric thin film of the multilayer film is not present below the pad electrode portion.

According to a specific aspect of an elastic wave device according to a preferred embodiment of the present invention, the multilayer film is substantially removed between the pad electrode portion and the support substrate below the pad electrode portion.

According to another specific aspect of an elastic wave device of a preferred embodiment of the present invention, the pad electrode portion is laminated onto the support substrate so that a lower surface of the pad electrode portion is located within a recess provided in an upper surface of the support substrate.

According to still another specific aspect of an elastic wave device of a preferred embodiment of the present invention, the piezoelectric thin film is a piezoelectric single-crystal thin film. Preferably, Fe may be added to the piezoelectric thin film.

According to yet another specific aspect of an elastic wave device of a preferred embodiment of the present invention, the multilayer film includes a low acoustic velocity film that contacts with a lower surface of the piezoelectric thin film and that has a lower acoustic velocity of a bulk wave propagating therein than the acoustic velocity of a bulk wave propagating in the piezoelectric thin film, and a high acoustic velocity film that is laminated to a lower surface of the low acoustic velocity film and that has a higher acoustic velocity of a bulk wave propagating therein than the acoustic velocity of an elastic wave propagating in the piezoelectric thin film.

According to still another specific aspect of an elastic wave device of a preferred embodiment of the present invention, at least a portion of a layer in a multilayer body including the high acoustic velocity film and the low acoustic velocity film is further provided between the pad electrode portion and the support substrate.

According to another specific aspect of an elastic wave device of a preferred embodiment of the present invention, the elastic wave device further includes a low acoustic velocity film that contacts with a lower surface of the piezoelectric thin film and that has a lower acoustic velocity of a bulk wave propagating therein than the acoustic velocity of a bulk wave propagating in the piezoelectric thin film. The support substrate preferably is a high acoustic velocity support substrate that is laminated to a lower surface of the low acoustic velocity film and that has a higher acoustic velocity of a bulk wave propagating therein than the acoustic velocity of an elastic wave propagating in the piezoelectric thin film.

According to still another specific aspect of an elastic wave device of a preferred embodiment of the present invention, the external connection terminal includes a metal bump.

According to yet another specific aspect of an elastic wave device of a preferred embodiment of the present invention, the lead electrode portion of the wiring electrode is continuous with the pad electrode portion, spanning from an upper surface of the multilayer film and along a side surface of the multilayer film, and the side surface of the multilayer film where the lead electrode portion is formed is slanted relative to the upper surface of the support substrate so as to become closer to the interdigital transducer electrode as the side surface progresses upward.

According to still another specific aspect of an elastic wave device of a preferred embodiment of the present invention, a step portion is provided in the side surface of the multilayer film where the lead electrode portion is provided.

According to still another specific aspect of an elastic wave device of a preferred embodiment of the present invention, a plurality of interdigital transducer electrodes are provided as the interdigital transducer electrode, adjacent interdigital transducer electrodes are electrically connected, and the elastic wave device further includes a connecting wire provided on at least a portion of a layer of the multilayer film.

According to still another specific aspect of an elastic wave device of a preferred embodiment of the present invention, the connecting wire is provided so that at least the piezoelectric thin film of the multilayer film is not present below the connecting wire.

According to another specific aspect of an elastic wave device of a preferred embodiment of the present invention, a structure between the pad electrode portion and the support substrate is different from a structure between the connecting wire and the support substrate.

According to yet another specific aspect of an elastic wave device of a preferred embodiment of the present invention, the elastic wave device further includes a support frame, that encloses a region in which the interdigital transducer electrode is provided, the support frame being laminated directly or indirectly onto the support substrate and including an opening that opens upward; and a cover member provided that closes off the opening in the support frame. Here, the external connection terminal includes an under-bump metal layer that is bonded to an upper surface of the pad electrode portion and passes through the support frame and the cover member, and a metal bump bonded onto the under-bump metal layer.

According to still another specific aspect of an elastic wave device of a preferred embodiment of the present invention, the multilayer film is not present below the support frame.

According to another specific aspect of an elastic wave device of a preferred embodiment of the present invention, the elastic wave device further includes a partition wall that contacts with at least a portion of a layer in the multilayer film and the cover member.

In an elastic wave device according to a preferred embodiment of the present invention, an elastic wave device according to a preferred embodiment of the present invention may be further provided on the lower surface side of the support substrate, and a connecting electrode that electrically connects the upper surface-side elastic wave device and the lower surface-side elastic wave device may be provided in the support substrate. Preferably, the connecting electrode is a via hole electrode that passes through the support substrate.

A manufacturing method for an elastic wave device according to a preferred embodiment of the present invention includes forming a multilayer film including a piezoelectric thin film on a support substrate, forming an interdigital transducer electrode on one surface of the piezoelectric thin film, forming a wiring electrode including a lead electrode portion electrically connected to the interdigital transducer electrode and a pad electrode portion, and forming an external connection terminal so as to be electrically connected to the pad electrode portion.

In the step of forming the multilayer film, in the formation of the piezoelectric thin film, the piezoelectric thin film is patterned after the piezoelectric thin film is formed. Preferably, the piezoelectric thin film is patterned through etching.

According to elastic wave devices and manufacturing methods thereof according to various preferred embodiments of the present invention, the piezoelectric thin film is not present below the pad electrode portion, and thus the piezoelectric thin film does not easily peel away or break when bonding the external connection terminal, during mounting, or the like.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be made clear hereinafter through descriptions of specific preferred embodiments of the present invention with reference to the drawings. Note that the various preferred embodiments disclosed in the present specification are merely examples, and it is to be understood that partial replacements or combinations of configurations among different preferred embodiments are also possible.

Figure 1:
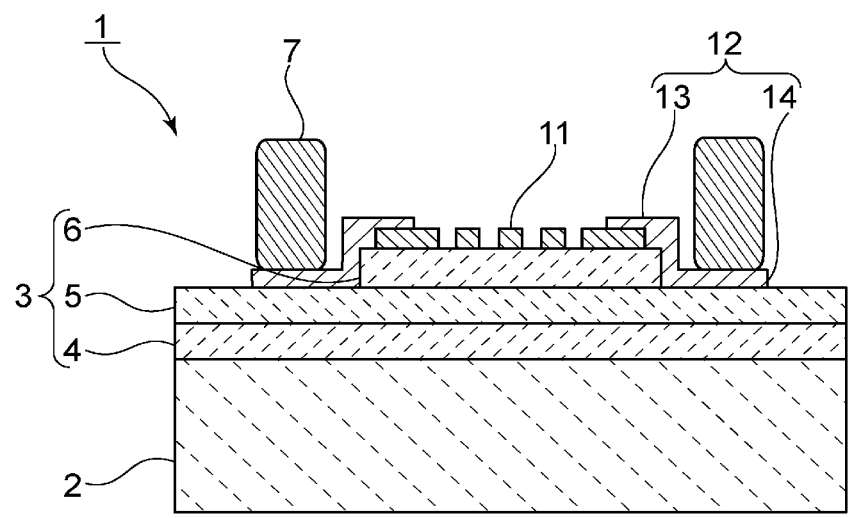
FIG. 1 is an elevational cross-sectional view of an elastic wave device according to a first preferred embodiment of the present invention.
Figure 2:
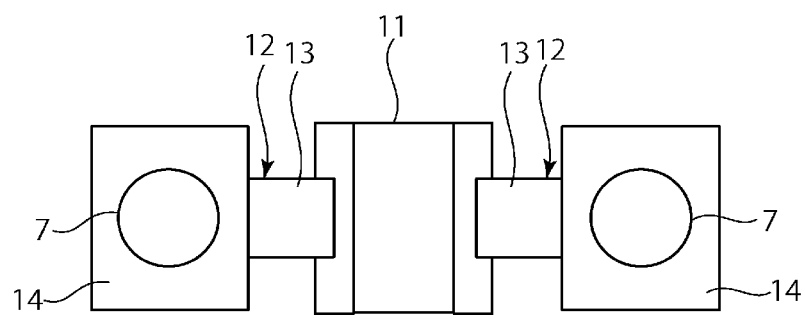
FIG. 2 is a schematic plan view of an electrode structure in the elastic wave device according to the first preferred embodiment of the present invention.

FIG. 1 is an elevational cross-sectional view of an elastic wave device according to a first preferred embodiment of the present invention, and FIG. 2 is a schematic plan view illustrating an electrode structure thereof.

An elastic wave device 1 includes a support substrate 2. In the present preferred embodiment, the support substrate 2 preferably is made of Si. However, the support substrate 2 is not limited to a semiconductor such as Si, and may be a piezoelectric material such as $LiTaO_3$, or a dielectric such as $SiO_2$, $Al_2O_3$, or the like.

A multilayer film 3 is laminated onto the support substrate 2. In the present preferred embodiment, the multilayer film 3 includes a high acoustic velocity film 4, a low acoustic velocity film 5, and a piezoelectric thin film 6, in that order from the bottom. The high acoustic velocity film 4 is preferably made of a material in which an acoustic velocity of bulk waves propagating therein is higher than the acoustic velocity of elastic waves propagating in the piezoelectric thin film 6. The low acoustic velocity film 5, meanwhile, is preferably made of a material in which an acoustic velocity of bulk waves propagating therein is lower than the acoustic velocity of bulk waves propagating in the piezoelectric thin film 6. The high acoustic velocity film 4 and the low acoustic velocity film 5 are preferably made of materials suited to fulfilling the acoustic velocity relationship. The high acoustic velocity film 4 is preferably made of silicon nitride (SiN) in the present preferred embodiment, for example. However, the high acoustic velocity film 4 is not limited to silicon nitride, and can be made of a suitable material such as aluminum nitride, aluminum oxide (alumina), silicon oxynitride, silicon carbide, diamond-like carbon (DLC), diamond, or the like.

The low acoustic velocity film 5 is preferably made of from silicon oxide ($SiO_2$) in the present preferred embodiment. However, the low acoustic velocity film 5 can be made of a suitable material such as glass, silicon oxynitride, tantalum oxide, a compound in which fluorine, carbon, boron, or the like is added to silicon oxide, and so on.

The low acoustic velocity film 5 and the high acoustic velocity film 4 are laminated below the piezoelectric thin film 6, and thus surface acoustic waves do not easily leak downward and are instead trapped in a region spanning up to the low acoustic velocity film 5. Surface acoustic waves are therefore able to propagate efficiently.

The piezoelectric thin film 6 is preferably made of a piezoelectric single-crystal thin film such as $LiTaO_3$ or $LiNbO_3$ in the present preferred embodiment. However, the piezoelectric thin film 6 may be made of a piezoelectric material aside from a piezoelectric single-crystal. In the case where the piezoelectric thin film 6 is preferably made of a piezoelectric single-crystal, the film breaks, peels away, and so on, more easily, and thus various preferred embodiments of the present invention are more effective. Note that when the wave length of an elastic wave determined from an interdigital transducer electrode period is represented by $\lambda$, the piezoelectric thin film is a film that is no thicker than about $1.5\lambda$, for example. Fe-doped $LiTaO_3$ can also be used as the piezoelectric thin film 6. Polarization reversal is significantly reduced or prevented in the piezoelectric thin film 6 in this case, and thus this structural configuration is preferable.

As illustrated in FIG. 1, the piezoelectric thin film is provided in a region covering only a portion of an upper surface of the low acoustic velocity film 5.

An interdigital transducer electrode 11 is laminated onto the upper surface of the piezoelectric thin film 6. The interdigital transducer electrode 11 is preferably made of a suitable metal or alloy. Al, Cu, Ag, Pt, W, Au, Ag—Pd, Al—Cu, Ti, Ni, NiCr, and the like can be given as an example of such a metal or alloy. The interdigital transducer electrode 11 may be made of a laminated metal film including a plurality of metal films laminated together.

As illustrated in FIG. 2, wiring electrodes 12 are electrically connected to the interdigital transducer electrode in the present preferred embodiment. Each of the wiring electrodes 12 includes a lead electrode portion 13 and a pad electrode portion 14 that extends from the lead electrode portion 13.

The wiring electrodes 12 can also be made of a suitable metal such as Al, Cu, or the like, or an alloy, for example.

Returning to FIG. 1, an external connection terminal 7 is bonded onto each pad electrode portion 14. In the present preferred embodiment, the external connection terminal 7 is preferably made of a metal stud bump. A stud bump made of Au is used in the present preferred embodiment, but a metal material aside from Au may be used instead.

When manufacturing the elastic wave device 1 according to the present preferred embodiment, the support substrate 2 is prepared first. Next, the multilayer film 3 is formed upon the support substrate 2. To be more specific, the high acoustic velocity film 4, the low acoustic velocity film 5, and the piezoelectric thin film 6 are formed in that order. When forming the piezoelectric thin film 6, a piezoelectric thin film is formed and then patterned in order to form the piezoelectric thin film 6 into a predetermined shape. It is preferable that the patterning be carried out through etching. Next, the interdigital transducer electrode 11 is formed upon the piezoelectric thin film 6. Furthermore, the wiring electrodes 12 are formed so as to be electrically connected to the interdigital transducer electrode 11. The external connection terminals 7 are then bonded onto the pad electrode portions 14. The elastic wave device 1 can be obtained in this manner.

In the present preferred embodiment, the pad electrode portions 14 are located on outer side portions of the region where the piezoelectric thin film 6 is provided. Accordingly, the piezoelectric thin film 6 is not present below the pad electrode portions 14. As a result, when bonding the external connection terminals 7, the piezoelectric thin film 6 does not easily break, peel away, or the like even when a downward force acts on the pad electrode portions 14.

The elastic wave device 1 preferably is what is known as a surface-mountable chip-size package (CSP) component. During mounting, the elastic wave device 1 is mounted onto a circuit board from the side on which the external connection terminals 7 are located. A force is exerted from the external connection terminals 7 toward the pad electrode portions 14 side during this mounting as well. According to the elastic wave device 1, the piezoelectric thin film 6 does not easily break, peel away, or the like, even under the effects of such a force.

Furthermore, the piezoelectric thin film 6 does not easily peel away, break, or the like even when the elastic wave device 1 undergoes a change in temperature and the external connection terminals 7, the pad electrode portions 14, or the like, which are preferably made of a metal, expand or contract. Accordingly, an elastic wave device 1 having a high yield and superior reliability is provided.

Figure 3:
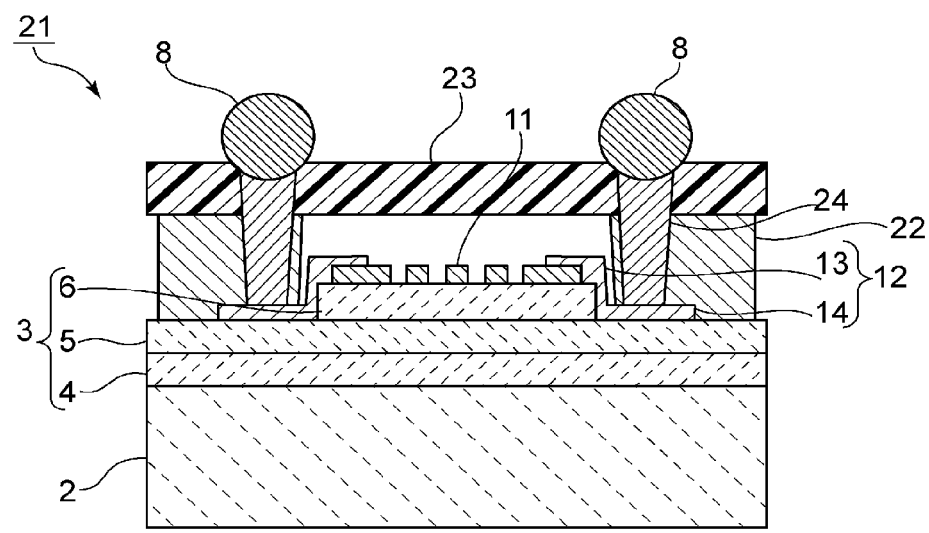
FIG. 3 is an elevational cross-sectional view of an elastic wave device according to a second preferred embodiment of the present invention.

FIG. 3 is an elevational cross-sectional view of an elastic wave device according to a second preferred embodiment of the present invention. An elastic wave device 21 preferably is an elastic wave device having what is known as a wafer-level package (WLP) structure. Aside from the package structure, the elastic wave device 21 according to the second preferred embodiment is the same as that according to the first preferred embodiment. Accordingly, like elements will be given like reference numerals, and detailed descriptions thereof will be omitted.

Figure 10:
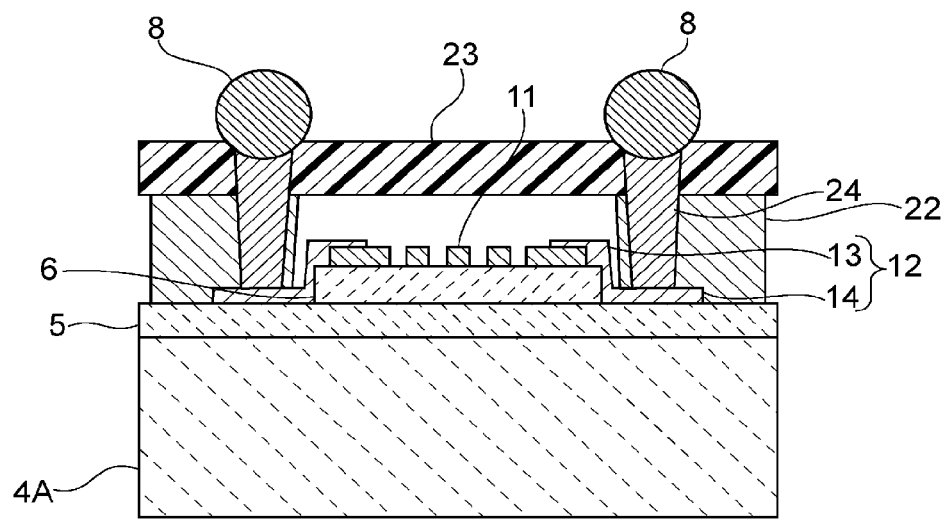
FIG. 10 is an elevational cross-sectional view of an elastic wave device according to a variation that uses a high acoustic velocity support substrate.

In the elastic wave device 21, the high acoustic velocity film 4, the low acoustic velocity film 5, and the piezoelectric thin film 6 are laminated onto the support substrate 2. In other words, the multilayer film 3 including the high acoustic velocity film 4, the low acoustic velocity film 5, and the piezoelectric thin film 6 is provided. The interdigital transducer electrode 11 is provided on the piezoelectric thin film 6. The wiring electrodes 12 are provided so as to be continuous with the interdigital transducer electrode 11. Note that elastic waves may be trapped within a portion where the piezoelectric thin film 6 and the low acoustic velocity film 5 are laminated by using a high acoustic velocity support substrate 4A illustrated in FIG. 10 instead of the high acoustic velocity film 4. In other words, the same advantageous effects are able be achieved by a structure in which the low acoustic velocity film 5 and the piezoelectric thin film 6 are laminated onto the high acoustic velocity support substrate 4A. Here, glass, silicon, or the like, alumina, a piezoelectric single-crystal such as $LiTaO_3$ or $LiNbO_3$, or the like is used as the material for the high acoustic velocity support substrate.

In the present preferred embodiment, a support frame is preferably provided upon the support substrate 2. The support frame 22 is made of a synthetic resin. A suitable thermosetting resin such as polyimide resin can be used as such a synthetic resin.

The support frame 22 is disposed so as to enclose a region where the interdigital transducer electrode 11 is provided. The support frame 22 covers the pad electrode portions 14.

A cover member 23 closes off an opening in the support frame 22. The cover member 23 is made of a suitable synthetic resin such as epoxy resin. However, the cover member 23 may be made of another insulating material such as an insulating ceramic material.

Through-holes pass through the support frame 22 and the cover member 23. The through-holes are filled with under-bump metal layers 24. The under-bump metal layers 24 can be made of a suitable metal such as Al, Cu, Ag, Pt, Au, AlCu, Ni, Pd, Sn, or the like, or an alloy thereof.

The pad electrode portions 14 are bonded to lower ends of the under-bump metal layers 24. External connection terminals 8 are bonded to upper ends of the under-bump metal layers 24. In the present preferred embodiment, the external connection terminals 8 are preferably made of solder bumps, for example. However, metal bumps made of a metal aside from solder may be used instead.

As described above, in the present preferred embodiment, the support frame 22, the cover member 23, the under-bump metal layers 24, and the external connection terminals 8 are provided, and thus a wafer-level package is provided. During mounting, the elastic wave device 21 can also be surface-mounted onto a circuit board from the side on which the external connection terminals 8 are located.

When bonding the solder bumps defining and functioning as the external connection terminals 8, when mounting the elastic wave device 21 on the circuit board, and so on, a force acts toward the pad electrode portions 14. However, the piezoelectric thin film 6 is not located below the pad electrode portions 14 in the present preferred embodiment either. Accordingly, the piezoelectric thin film 6 is prevented from breaking, peeling away, and so on, with certainty.

Note that it is sufficient that the portions of the pad electrode portions 14 where the under-bump metal layers 24 are bonded be located within the support frame 22. Accordingly, it is not absolutely necessary for the pad electrode portions 14 to be entirely covered by the support frame 22. In other words, it is sufficient for the support frame 22 to be provided so as to include a region, where the under-bump metal layers 24 are bonded, that corresponds to at least a portion of the pad electrode portions 14. Furthermore, in the first and second preferred embodiments, the piezoelectric thin film 6 need not be completely removed. In other words, the advantageous effects of preferred embodiments of the present invention are able to be achieved as long as the piezoelectric thin film 6 is substantially removed.

In addition, in the present preferred embodiment, the multilayer film 3 is not present below the support frame 22. In other words, the multilayer film 3 is located in a region surrounded by the support frame 22.

In the first and second preferred embodiments, the piezoelectric thin film 6 preferably is provided in a portion of a region of the multilayer film 3 that is above the low acoustic velocity film 5. The multilayer film 3 is able to be formed in such a manner using a suitable thin film forming method. In other words, the high acoustic velocity film 4, the low acoustic velocity film 5, and the piezoelectric thin film 6 are formed in that order upon the support substrate 2. The interdigital transducer electrode 11 is then formed through vapor deposition and a lift-off process or the like. The piezoelectric thin film is then patterned. The patterning of the piezoelectric thin film 6 is carried out by using a photolithography technique to form a resist pattern in which only the parts to be removed are left open, and then using an etching technique to remove the piezoelectric thin film. Wet etching, dry etching, or the like can be used for the etching. A fluorocarbon such as $CF_4$, a carbon chloride such as $CCl_4$, Ar, or the like can be used as a reactant gas for dry etching.

The piezoelectric thin film 6 located in regions where the pad electrode portions 14 are provided is removed in such a manner. Then, the wiring electrodes 12 including the pad electrode portions 14 are formed. The external connection terminals 7 are then formed upon the pad electrode portions 14. In the second preferred embodiment, the support frame 22 and the cover member 23 are formed after forming the wiring electrodes 12 including the pad electrode portions 14. Then, the under-bump metal layers 24 and the external connection terminals 8 are formed. Although the piezoelectric thin film 6 is described as being patterned after the interdigital transducer electrode 11 is formed in this example, this order may be reversed.

Figure 4:
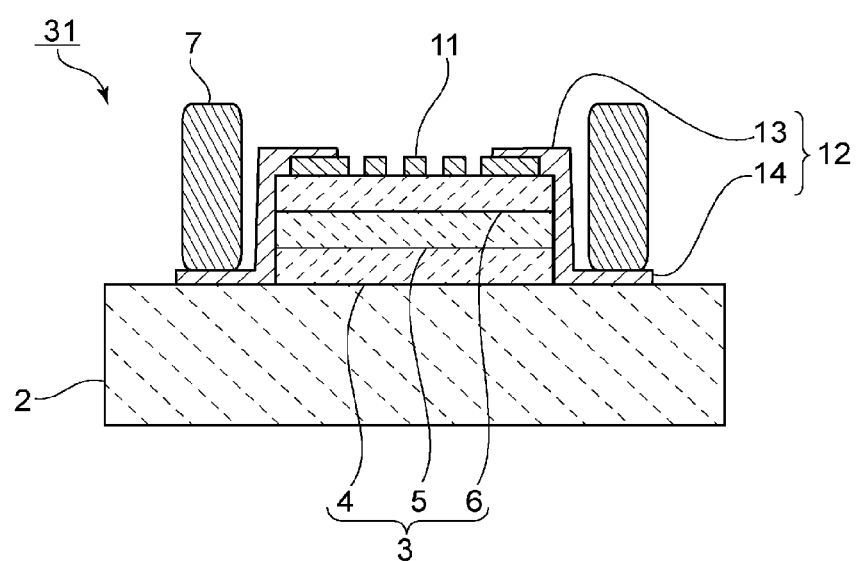
FIG. 4 is an elevational cross-sectional view of an elastic wave device according to a third preferred embodiment of the present invention.

FIG. 4 is an elevational cross-sectional view of an elastic wave device 31 according to a third preferred embodiment of the present invention. In the elastic wave device 31 according to the third preferred embodiment, none of the multilayer film 3 is located below the pad electrode portions 14. Other configurations are the same as in the first preferred embodiment, and thus the same reference numerals will be given and descriptions thereof will be omitted.

As illustrated in FIG. 4, in the present preferred embodiment, neither the piezoelectric thin film 6 nor the high acoustic velocity film 4 and the low acoustic velocity film 5 are located below the pad electrode portions 14. In addition, although not particularly limited, the piezoelectric thin film 6 has the same planar shape as the high acoustic velocity film 4 and the low acoustic velocity film 5.

In the present preferred embodiment as well, the piezoelectric thin film 6 is not located below the pad electrode portions 14, and thus the piezoelectric thin film 6 does not easily break, peel away, or the like, when bonding the external connection terminals 7, during mounting, and so on, in the same manner as in the first preferred embodiment.

When etching the piezoelectric thin film 6 during manufacturing according to the present preferred embodiment, the high acoustic velocity film 4 and the low acoustic velocity film 5 may be removed through etching in the same manner.

Thus, a structural configuration in which none of the multilayer film 3 is present below the pad electrode portions 14 may be used, as in the present preferred embodiment. In addition, because it is sufficient for at least the piezoelectric thin film 6 to not be present below the pad electrode portions 14, a structure in which neither the piezoelectric thin film 6 nor one of the high acoustic velocity film 4 and the low acoustic velocity film 5 are present below the pad electrode portions 14 may be used.

In a structure where none of the multilayer film 3 is located below the pad electrode portions 14 as in the present preferred embodiment, it is desirable that a region where the multilayer film 3 is not present be provided on the support substrate 2 on outer side portions of the regions where the pad electrode portions 14 are provided. The upper surface of the support substrate 2 will be exposed in the dicing region as well in this case, which makes cutting with a dicing machine easy. Accordingly, the dicing time is shortened, and it is difficult for interlayer separation or the like to occur when cutting with a dicing machine.

Figure 5:
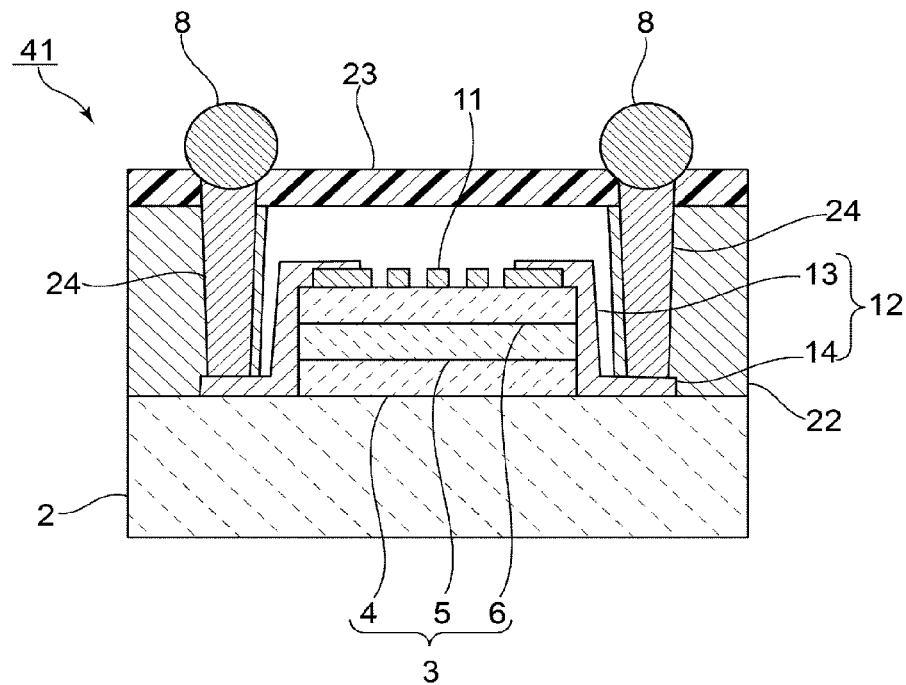
FIG. 5 is an elevational cross-sectional view of an elastic wave device according to a fourth preferred embodiment of the present invention.

FIG. 5 is an elevational cross-sectional view of an elastic wave device 41 according to a fourth preferred embodiment of the present invention. The elastic wave device 41 is the same as the elastic wave device 31, aside from having a WLP structure that includes the support frame 22, the cover member 23, the under-bump metal layers 24, and the external connection terminals 8 in the same manner as in the second preferred embodiment. Accordingly, like elements will be given like reference numerals, and the descriptions thereof will be omitted. None of the multilayer film 3 is located below the pad electrode portions 14 in the present preferred embodiment as well. Accordingly, the same actions and advantageous effects as in the third preferred embodiment are able to be achieved. Note that in the third and fourth preferred embodiments, the multilayer film 3 need not be completely removed. In other words, the advantageous effects of various preferred embodiments of the present invention are able to be achieved as long as the multilayer film 3 is substantially removed.

Figure 12:
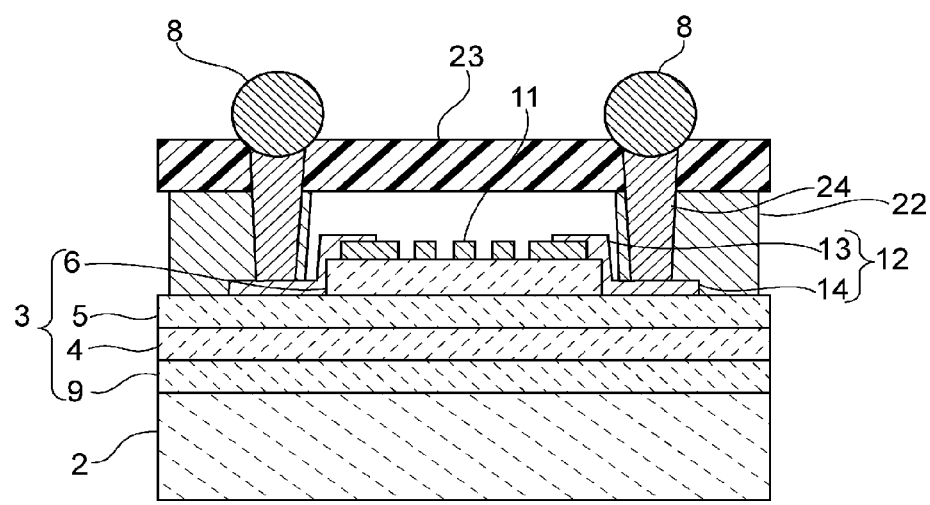
FIG. 12 is an elevational cross-sectional view of an elastic wave device according to a variation of the second preferred embodiment of the present invention.

In the first to fourth preferred embodiments of the present invention, the multilayer film structure preferably includes the piezoelectric thin film, the low acoustic velocity film, and the high acoustic velocity film in that order from above, but as illustrated in FIG. 12, a bonding material layer 9 made of a dielectric or the like may be provided between the high acoustic velocity film 4 and the support substrate 2.

Figure 6:
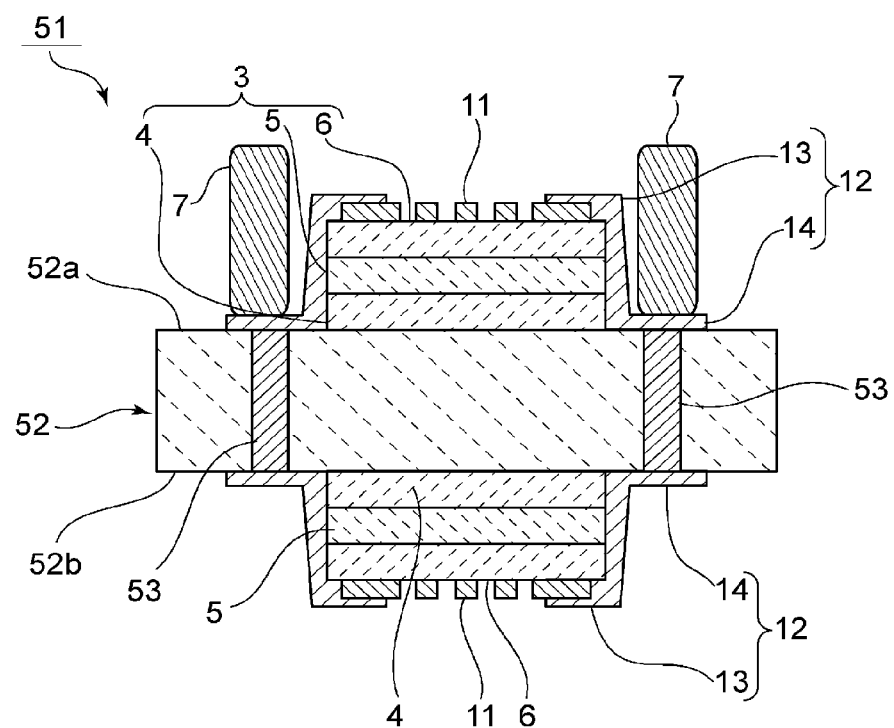
FIG. 6 is an elevational cross-sectional view of an elastic wave device according to a fifth preferred embodiment of the present invention.

FIG. 6 is an elevational cross-sectional view of an elastic wave device according to a fifth preferred embodiment of the present invention. An elastic wave device 51 includes a support substrate 52. As in the third preferred embodiment, the multilayer film 3, the interdigital transducer electrode 11, the wiring electrodes 12, and the external connection terminals 7 are provided on the upper surface of the support substrate 52. In other words, the same elastic wave device as in the third preferred embodiment is defined by the support substrate 52 and the structures on the upper surface of the support substrate 52.

In the present preferred embodiment, an elastic wave device is provided on a lower surface 52b of the support substrate 52 as well. In other words, the multilayer film 3, the interdigital transducer electrode 11, and the wiring electrodes are provided on the lower surface 52b of the support substrate 52. The external connection terminals 7 are not provided on the lower surface 52b side of the support substrate 52. However, the external connection terminals 7 may be provided on the lower surface 52b of the support substrate 52 as well. Via hole electrodes 53 and 53 are provided in the support substrate 52 so as to pass therethrough from an upper surface 52a to the lower surface 52b. The pad electrode portions 14 on the upper surface side and the pad electrode portions 14 on the lower surface side are electrically connected by the via hole electrodes 53 and 53. The via hole electrodes 53 can be made of a suitable metal or alloy.

Thus, the same elastic wave device as in the third preferred embodiment may further be formed on the lower surface 52b side of the support substrate 52, as in the present preferred embodiment.

Figure 7:
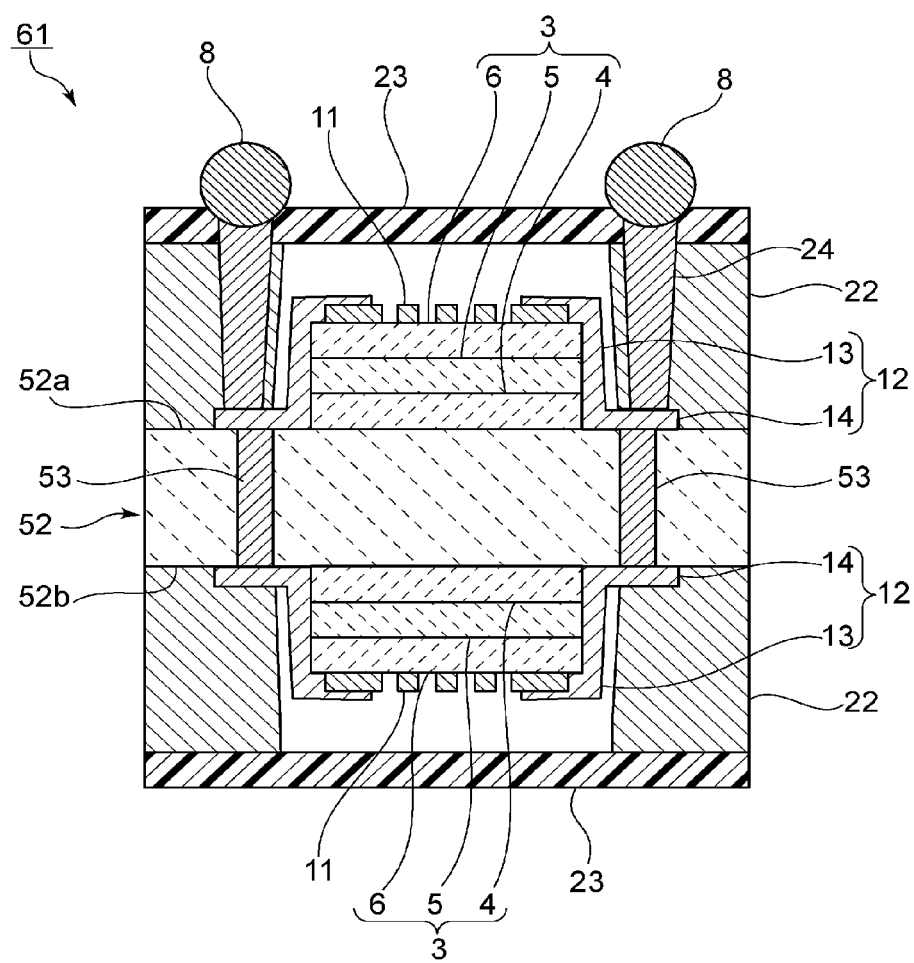
FIG. 7 is an elevational cross-sectional view of an elastic wave device according to a sixth preferred embodiment of the present invention.

FIG. 7 is an elevational cross-sectional view of an elastic wave device according to a sixth preferred embodiment of the present invention. An elastic wave device 61 includes the support substrate 52 and the via hole electrodes 53 and 53, in the same manner as the fifth preferred embodiment. In the elastic wave device 61, the same structure as the elastic wave device 41 according to the fourth preferred embodiment is provided on the upper surface 52a of the support substrate 52. Accordingly, elements that are the same as in the fourth preferred embodiment will be given the same reference numerals, and descriptions thereof will be omitted.

In the present preferred embodiment, the same elastic wave device as the elastic wave device on the upper surface 52a side is provided on the lower surface 52b side of the support substrate 52 as well. However, the under-bump metal layers 24 and the external connection terminals 8 are not provided on the lower surface 52b side.

Thus, an elastic wave device having a wafer-level package structure may be provided on both the upper surface 52a and the lower surface 52b of the support substrate 52, as with the elastic wave device 61.

Note that the under-bump metal layers 24 and the external connection terminals 8 may be provided on the lower surface 52b side as well in the elastic wave device 61. In this case, mounting is able to be carried out using either the upper surface side or the lower surface side of the elastic wave device 61.

Although the via hole electrodes 53 are used in the elastic wave devices 51 and 61 according to the fifth and sixth preferred embodiments, connection electrodes aside from the via hole electrodes 53 may be used in order to electrically connect the upper surface 52a side and the lower surface 52b side of the support substrate 52. In other words, connection electrodes or the like that follow a side surface of the support substrate 52 may be used.

With the elastic wave devices 51 and 61 according to the fifth and sixth preferred embodiments as well, the piezoelectric thin film 6 does not easily peel away or break when bonding the external connection terminals 7 and 8, during surface mounting, and so on. In addition, according to the elastic wave devices 51 and 61, the elastic wave device is also provided on the lower surface 52b side of the support substrate 52, which makes it possible to achieve a higher density and further miniaturization of an electronic device.

When manufacturing the elastic wave device 51, through-holes may be made of the lower surface 52b side of the support substrate 52, and the via hole electrodes 53 may then be formed, after forming the constituent elements of the elastic wave device on the upper surface 52a of the support substrate 52 in the same manner as in the third preferred embodiment. The constituent elements of the elastic wave device may then be formed on the lower surface 52b side, in the same manner as on the upper surface 52a side. When manufacturing the elastic wave device 61, the upper surface 52a side of the support substrate 52 may be formed in the same manner as in the fourth preferred embodiment. The via hole electrodes 53 and 53 are then formed. Next, the multilayer film 3, the interdigital transducer electrode 11, and the wiring electrodes 12 may be formed in that order on the lower surface 52b side of the support substrate 52 through the same method as in the fourth preferred embodiment, and the support frame 22 and the cover member 23 may then be formed.

Note that the elastic wave device 31 according to the third preferred embodiment was described as being easy to cut with a dicing machine due to the upper surface of the support substrate 2 being exposed in the dicing region. In the case where the multilayer film 3 including the piezoelectric thin film 6 is not present in the dicing region in this manner, cutting with a dicing machine is able to be carried out with ease. This will be described in detail using the reference examples illustrated in FIGS. 8 and 9.

Figure 8:
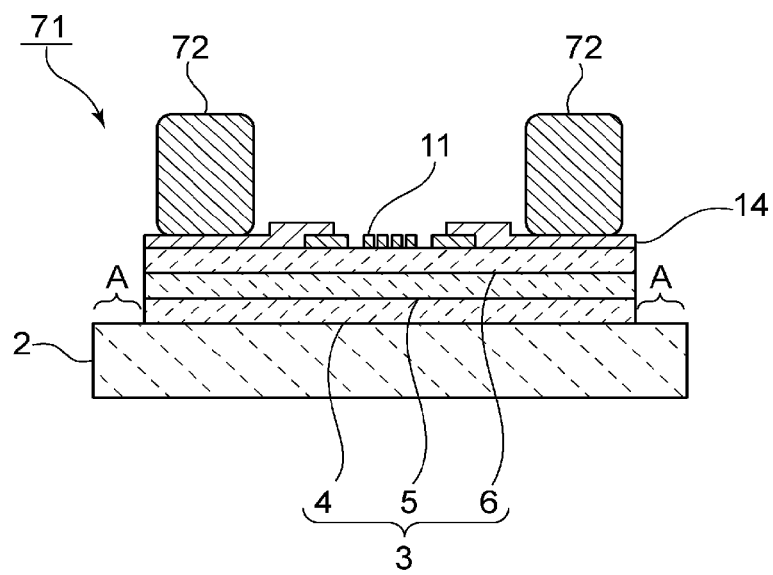
FIG. 8 is a schematic elevational cross-sectional view illustrating a reference example in which a piezoelectric thin film is not formed in a dicing region.

In an elastic wave device 71 according to the reference example illustrated in FIG. 8, the multilayer film 3 and the interdigital transducer electrode 11 are laminated onto the support substrate 2. The support substrate 2 and the multilayer film 3 have the same configurations as in the first preferred embodiment. In other words, the multilayer film 3 includes the high acoustic velocity film 4, the low acoustic velocity film 5, and the piezoelectric thin film 6. The interdigital transducer electrode 11 is provided upon the piezoelectric thin film 6. The pad electrode portions 14 are provided so as to be electrically connected to the interdigital transducer electrode 11. External connection terminals 72 are provided on the pad electrode portions 14. The external connection terminals 72 are made of metal bumps. In the present reference example, the piezoelectric thin film 6 is provided below the pad electrode portions 14, but the piezoelectric thin film 6 is not located in the dicing region, which is indicated by the letter A. In other words, the upper surface of the support substrate 2 is exposed in the dicing region A, in the same manner as with the elastic wave device 31 according to the third preferred embodiment. Accordingly, cutting with a dicing machine is able to be carried out with ease.

Figure 9:
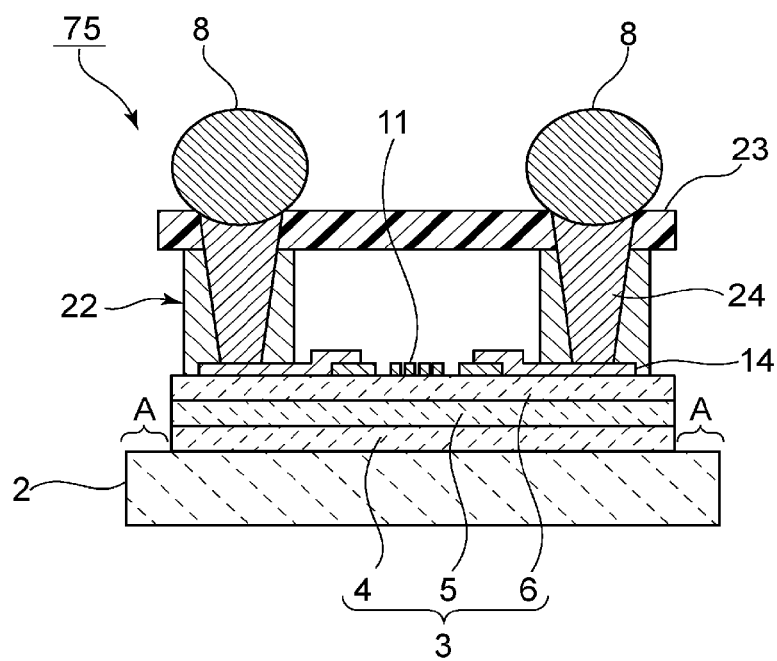
FIG. 9 is an elevational cross-sectional view illustrating another reference example in which a piezoelectric thin film is not formed in a dicing region.

Likewise, in an elastic wave device 75 according to the other reference example illustrated in FIG. 9, the upper surface of the support substrate 2 is exposed in the dicing region A. Accordingly, cutting with a dicing machine is able to be carried out with ease. Note that aside from having a WLP structure, the elastic wave device 75 is the same as the elastic wave device 71. Accordingly, the multilayer film 3 including the high acoustic velocity film 4, the low acoustic velocity film 5, and the piezoelectric thin film 6 is provided on the support substrate 2. The interdigital transducer electrode 11 and the pad electrode portions 14 are provided on the multilayer film 3. The support frame 22 and the cover member 23 are disposed so as to cover the pad electrode portions 14. The under-bump metal layers 24 are provided in through-holes that pass through the support frame 22 and the cover member 23. The under-bump metal layers 24 are bonded to the pad electrode portions 14. The external connection terminals 8 are bonded onto the under-bump metal layers 24.

As is clear from the descriptions of the elastic wave devices 71 and 75 according to the above reference examples, the piezoelectric thin film 6 is prevented from breaking, peeling away, and the like with certainty during cutting with a dicing machine in the case where the piezoelectric thin film 6 is not present above the dicing region A. Accordingly, it is desirable that at least the piezoelectric thin film 6 in the multilayer film 3 not be present in the dicing region. However, it is further preferable that none of the multilayer film 3 be present in the dicing region A, as in the third preferred embodiment, the elastic wave devices 71 and 75, and so on. Doing so makes it even easier to cut with a dicing machine.

Meanwhile, as described with reference to FIG. 3, the multilayer film 3, the piezoelectric thin film 6, and so on are not present below the support frame 22 in the preferred embodiment illustrated in FIG. 3. Likewise, the multilayer film 3, the piezoelectric thin film 6, and so on are not present below the support frame in the wafer-level package structure preferred embodiments illustrated in FIGS. 5 and 7.

Figure 13:
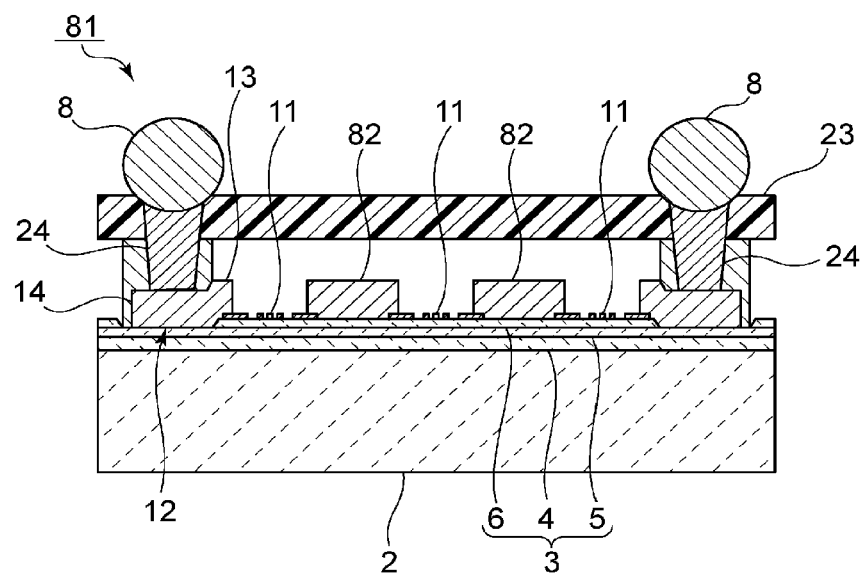
FIG. 13 is an elevational cross-sectional view of an elastic wave device according to a seventh preferred embodiment of the present invention.
Figure 14:
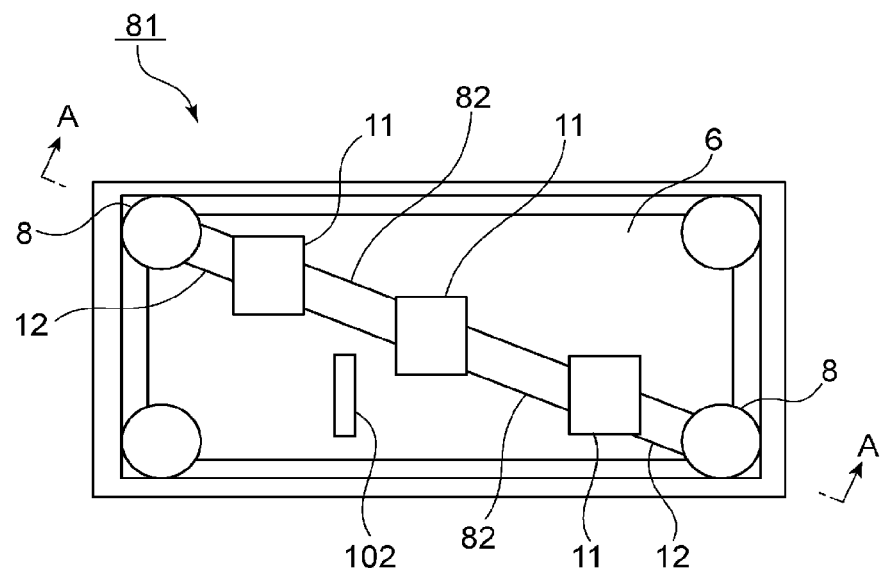
FIG. 14 is a schematic plan view for illustrating an electrode structure in the elastic wave device according to the seventh preferred embodiment of the present invention.

FIG. 13 is an elevational cross-sectional view of an elastic wave device according to a seventh preferred embodiment of the present invention, and FIG. 14 is a schematic plan view illustrating an electrode structure in the elastic wave device according to the seventh preferred embodiment.

In an elastic wave device 81 according to the seventh preferred embodiment, the multilayer film 3 is laminated onto the support substrate 2. The multilayer film 3 includes the high acoustic velocity film 4, the low acoustic velocity film 5, and the piezoelectric thin film 6, in that order from the bottom. The materials of which the support substrate 2 and the multilayer film 3 are formed are the same as in the first to sixth preferred embodiments.

The elastic wave device 81 differs from the elastic wave device 21 in that a plurality of interdigital transducer electrodes 11, 11, and 11 are provided on the piezoelectric thin film 6. The plurality of interdigital transducer electrodes 11, 11, and 11 are provided on the piezoelectric thin film 6, as schematically illustrated in FIG. 14. In FIG. 14, regions in which the interdigital transducer electrodes are provided are schematically represented by rectangular boxes. FIG. 13 is a diagram corresponding to a cross-section taken along the A-A line indicated in FIG. 14.

Adjacent interdigital transducer electrodes 11 and 11 are electrically connected by a connecting wire 82. The connecting wire 82 is made of the same metal material as the wiring electrodes 12. However, the connecting wire 82 may be made of another metal.

Thus, a plurality of interdigital transducer electrodes 11, 11, and 11 may be provided on the piezoelectric thin film 6, and a filter circuit may be thus defined, as with the elastic wave device 81. In this manner, two or more interdigital transducer electrodes 11 may be provided on the piezoelectric thin film 6 in a preferred embodiment of the present invention.

The connecting wire 82 is provided on the piezoelectric thin film 6. The rest of the configuration of the elastic wave device 81 is the same as the elastic wave device 21 illustrated in FIG. 3, and thus like elements will be given like reference numerals and descriptions thereof will be omitted.

The piezoelectric thin film 6 is not present below the pad electrode portions 14 in the elastic wave device 81 as well. Accordingly, the piezoelectric thin film 6 does not easily peel away, break, or the like, when bonding the external connection terminals 8, when mounting the elastic wave device 81, or the like.

Figure 15:
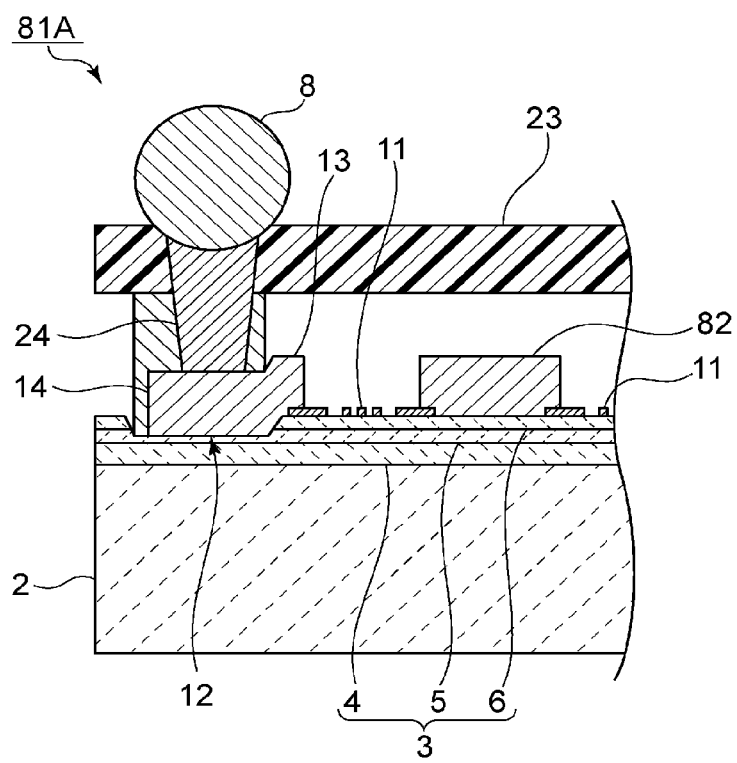
FIG. 15 is a partially cut-out elevational cross-sectional view for illustrating a first variation of the elastic wave device according to the seventh preferred embodiment of the present invention.

FIG. 15 is a partially cut-out elevational cross-sectional view of an elastic wave device 81A according to a first variation of the seventh preferred embodiment. In the elastic wave device 81, the pad electrode portions 14 are provided on the upper surface of the low acoustic velocity film 5. To rephrase, the high acoustic velocity film 4 and the low acoustic velocity film 5 are present between the pad electrode portions 14 and the support substrate 2. As opposed to this, in the elastic wave device 81A, the high acoustic velocity film 4 and a portion of the low acoustic velocity film 5 layer are present between the pad electrode portions 14 and the support substrate 2, as illustrated in FIG. 15. To rephrase, a layer corresponding to at least a portion of the layered portion of the high acoustic velocity film 4 and the low acoustic velocity film 5 is present between the support substrate 2 and the pad electrode portions 14. In this manner, at least a portion of the layers in the multilayer film 3, excluding the piezoelectric thin film 6, may be present between the pad electrode portions 14 and the support substrate 2. Such a configuration is able to be achieved with ease by adjusting etching conditions when etching the multilayer film 3 in the areas where the pad electrode portions 14 are to be formed.

Figure 16:
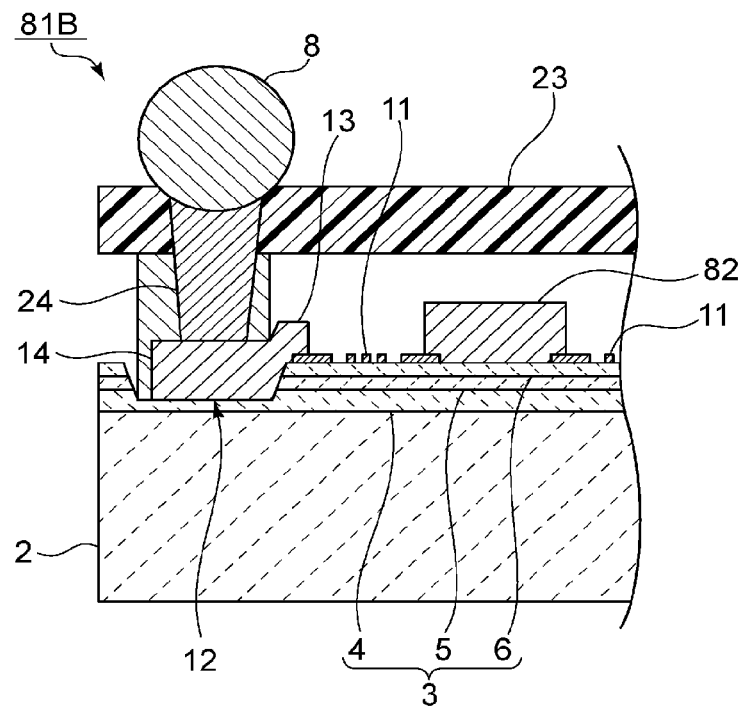
FIG. 16 is a partially cut-out elevational cross-sectional view for illustrating a second variation of the elastic wave device according to the seventh preferred embodiment of the present invention.

FIG. 16 is a partially cut-out elevational cross-sectional view of an elastic wave device 81B according to a second variation of the elastic wave device 81. In the elastic wave device 81B according to the second variation, only a portion of the high acoustic velocity film 4 layer in the multilayer film 3 is present between the lower surface of the pad electrode portions 14 and the support substrate 2. In this manner, only a portion of the high acoustic velocity film 4 layer may be present between the pad electrode portions 14 and the support substrate 2.

Figure 17:
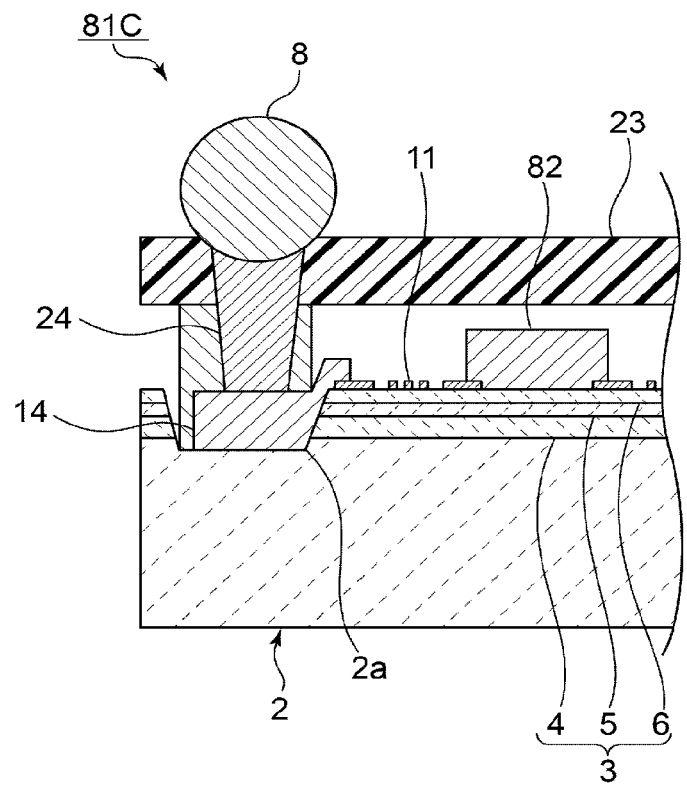
FIG. 17 is a partially cut-out elevational cross-sectional view for illustrating a third variation of the elastic wave device according to the seventh preferred embodiment of the present invention.

Furthermore, FIG. 17 is a partially cut-out elevational cross-sectional view of an elastic wave device 81C according to a third variation of the elastic wave device 81. In the elastic wave device 81C according to the third variation, recesses 2a are formed in the upper surface of the support substrate 2. The pad electrode portions 14 are provided so as to make contact with inner base surfaces of the corresponding recesses 2a. Such recesses 2a are able to be obtained when etching away a portion of the multilayer film 3, for example, by continuing the etching after the multilayer film 3 has been removed.

As illustrated in FIGS. 15 to 17, in the present invention, at least a portion of the layers in the multilayer film 3, with the exception of the piezoelectric thin film 6, may be provided between the support substrate 2 and the pad electrode portions 14; the entire multilayer film 3 may be removed; or the recesses 2a may be provided by over-etching the upper surface of the support substrate 2. Such a structural configuration is able to be applied in the first to sixth preferred embodiments as well as in the seventh preferred embodiment.

Figure 18:
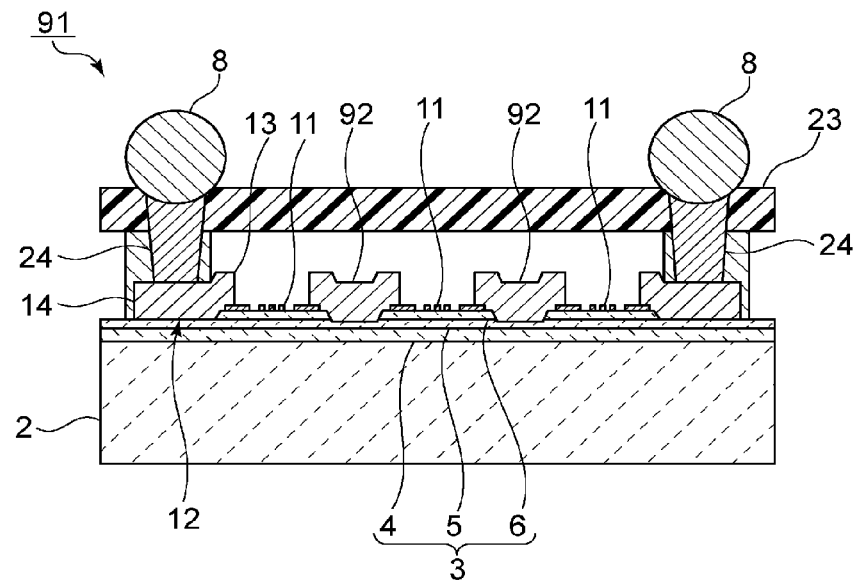
FIG. 18 is an elevational cross-sectional view of an elastic wave device according to an eighth preferred embodiment of the present invention.

FIG. 18 is an elevational cross-sectional view of an elastic wave device according to an eighth preferred embodiment of the present invention.

An elastic wave device 91 includes the plurality of interdigital transducer electrodes 11, 11, and 11 in the same manner as the elastic wave device 81. Adjacent interdigital transducer electrodes 11 and 11 are connected by a connecting wire 92. However, in the elastic wave device 91, the high acoustic velocity film 4 and a portion of the low acoustic velocity film 5 layer are present between the lower surface of the connecting wire 92 and the support substrate 2. In other words, according to the present preferred embodiment, the multilayer film 3 is etched so as to remove the piezoelectric thin film 6 and a portion of the low acoustic velocity film 5 layer. The connecting wire 92 is formed thereafter.

In addition, in the elastic wave device 91, the piezoelectric thin film 6 is removed from outer side portions of the regions where the pad electrode portions 14 are provided.

Other structural configurations of the elastic wave device 91 are the same as in the elastic wave device 81. Thus, the piezoelectric thin film 6 and a portion of the low acoustic velocity film 5 layer may be removed below the connecting wire 92, as in the elastic wave device 91.

Figure 19:
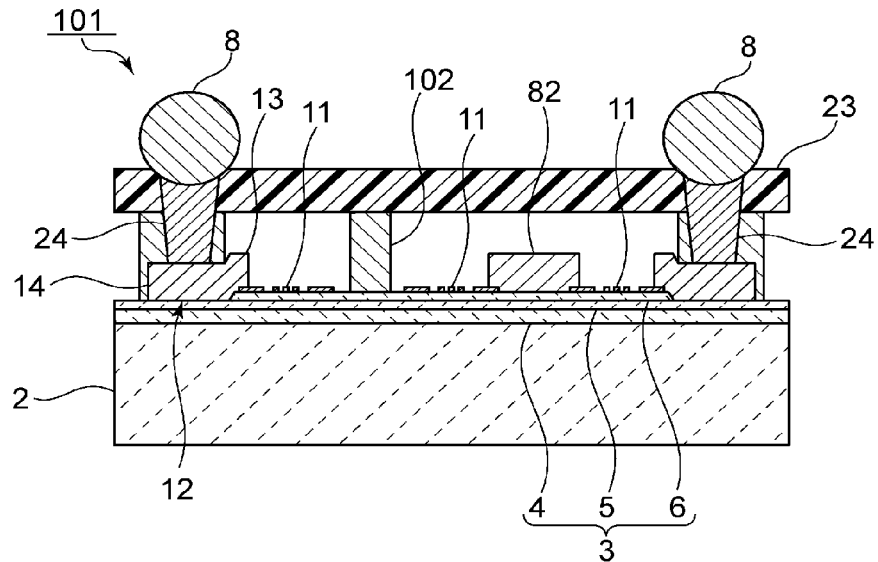
FIG. 19 is an elevational cross-sectional view of an elastic wave device according to a ninth preferred embodiment of the present invention.

FIG. 19 is an elevational cross-sectional view of an elastic wave device according to a ninth preferred embodiment of the present invention. The plurality of interdigital transducer electrodes 11, 11, and 11 are provided in an elastic wave device 101, and a single set of adjacent interdigital transducer electrodes 11 and 11 are electrically connected by a connecting wire 82. The remaining adjacent interdigital transducer electrodes 11 and 11 are electrically connected by a connecting wire in an area located more to the front in the drawing (not illustrated). A partition wall 102 is provided in the cross-section illustrated in FIG. 19. The partition wall 102 is made of an insulating material such as a ceramic material, a synthetic resin, or the like. A lower end of the partition wall 102 is bonded onto the piezoelectric thin film 6, and an upper end of the partition wall 102 is bonded to the lower surface of the cover member 23. Providing the partition wall 102 makes it possible to prevent the cover member 23 from collapsing.

Figure 20:
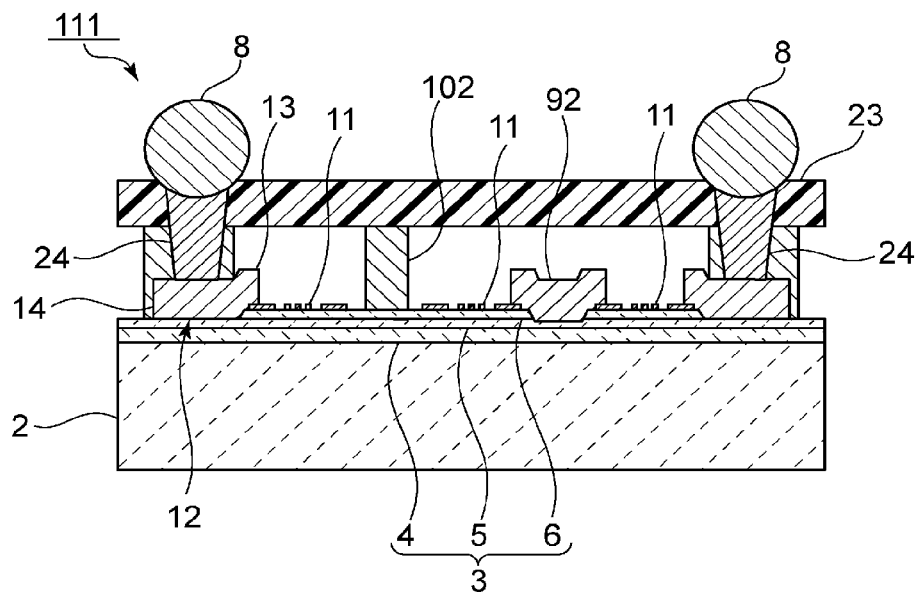
FIG. 20 is an elevational cross-sectional view of an elastic wave device according to a tenth preferred embodiment of the present invention.

FIG. 20 is an elevational cross-sectional view of an elastic wave device according to a tenth preferred embodiment of the present invention. An elastic wave device 111 has almost the same structure as the elastic wave device 101. However, in the elastic wave device 111, the connecting wire 92 that connects adjacent interdigital transducer electrodes 11 and 11 is provided in the same manner as in the elastic wave device 91. In other words, the connecting wire 92 is provided after first etching away the piezoelectric thin film 6 and a portion of the low acoustic velocity film 5. Other structural configurations of the elastic wave device 111 are the same as in the elastic wave device 101.

Figure 21:
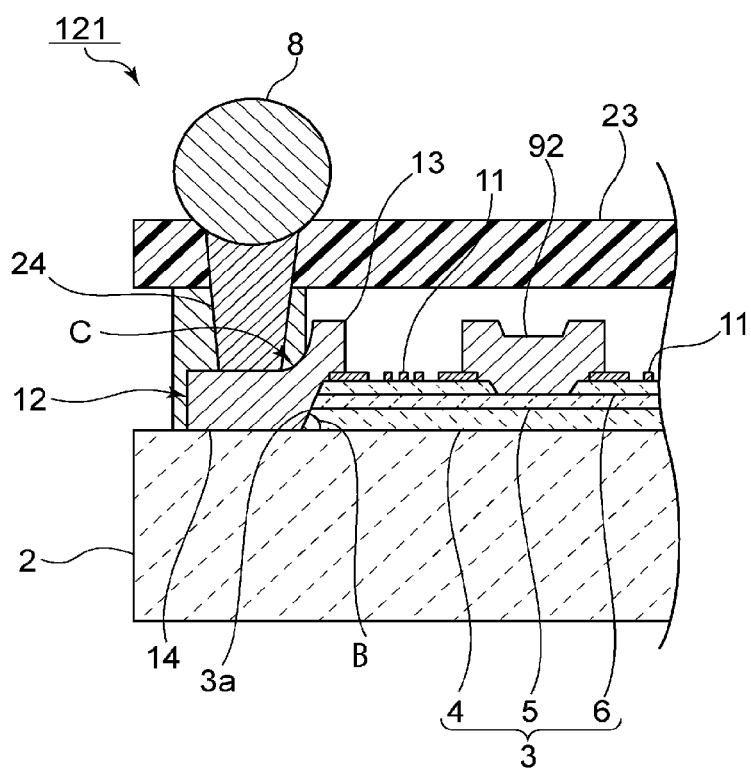
FIG. 21 is a partially cut-out elevational cross-sectional view for illustrating a first variation of the elastic wave device according to the eighth preferred embodiment illustrated in FIG. 18.

FIG. 21 is a partially cut-out elevational cross-sectional view of an elastic wave device according to a first variation of the eighth preferred embodiment. In an elastic wave device 121 illustrated in FIG. 21, the wiring electrodes 12 that include the lead electrode portions 13 and the pad electrode portions 14 extend from the upper surface of the multilayer film toward the upper surface of the support substrate 2. To rephrase, the lead electrode portions 13 are continuous with the pad electrode portions 14, spanning from the upper surface of the multilayer film 3 and along a side surface 3a of the multilayer film 3. Here, the side surface 3a is a slanted surface that is slanted relative to the upper surface of the support substrate 2 so as to approach the interdigital transducer electrode 11 side as the side surface progresses upward. Because the side surface 3a is slanted in this manner, the lead electrode portion 13 is able to be brought into closer contact with the side surface 3a. In addition, in the lead electrode portions 13, the curvature of an upper surface portion indicated by an arrow C is able to be made less sharp. This makes it difficult for disconnects to occur in the lead electrode portions 13. An angle B of the slanted surface is preferably no greater than about 85°, more preferably no greater than about 80°, and still more preferably no greater than about 60°, for example.

In the elastic wave device 121, the pad electrode portions 14 are in direct contact with the upper surface of the support substrate 2. Accordingly, a height direction dimension between the lower surfaces of the pad electrode portions 14 and the upper surfaces of the lead electrode portions 13 is greater. In this case, there is a problem in that it is easier for disconnects to occur in the lead electrode portions 13 in the case where the side surface of the multilayer film 3 extends in a direction perpendicular or substantially perpendicular to the support substrate 2 instead of being a slanted surface.

As opposed to this, according to a preferred embodiment of the present variation, the curvature of the portion indicated by the arrow C is able to be increased, which makes it possible to effectively prevent disconnects from occurring in the lead electrode portions 13.

Figure 22:
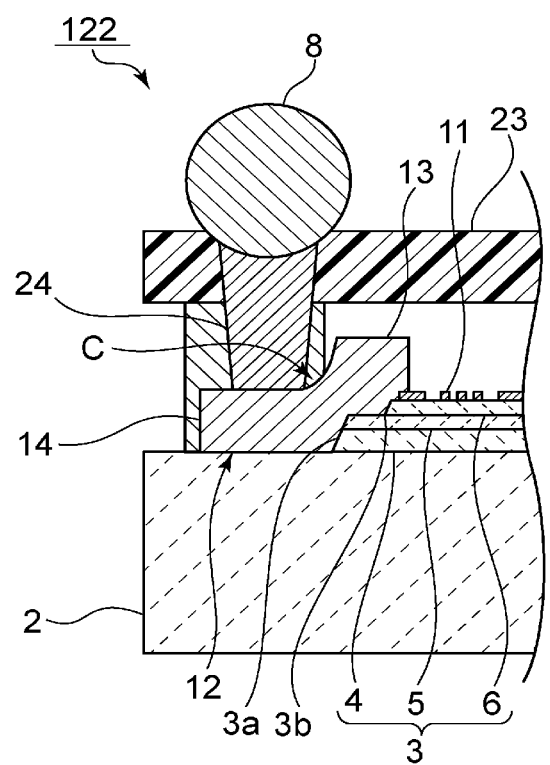
FIG. 22 is a partially cut-out elevational cross-sectional view for illustrating a second variation of the elastic wave device according to the eighth preferred embodiment illustrated in FIG. 18.

FIG. 22 is a partially cut-out elevational cross-sectional view illustrating a second variation of the eighth preferred embodiment. In an elastic wave device 122 according to the present variation, a step portion 3b including a planar surface portion extending in substantially the horizontal direction is provided in the side surface 3a of the multilayer film 3. Accordingly, the lead electrode portion 13 extends downward from the upper surface of the multilayer film 3 along the step portion 3b, and thus the curvature of the portion of the lead electrode portion 13 indicated by the arrow C is able to be effectively increased. This makes it possible to effectively prevent disconnects from occurring in the lead electrode portions 13. Note that two or more such step portions may be provided in the side surface of the multilayer film 3.

Note that it is not absolutely necessary for the planar surface portion to extend in substantially the horizontal direction. It is sufficient for the planar surface portion to have a lower angle of slant than the rest of the side surface 3a.

Although the multilayer film 3 preferably has a structure in which the high acoustic velocity film 4, the low acoustic velocity film 5, and the piezoelectric thin film 6 are laminated in the first to sixth preferred embodiments and the aforementioned reference examples, the laminated structure of the multilayer film 3 according to the present invention is not particularly limited as long as a plurality of films including the piezoelectric thin film 6 are laminated. In other words, the multilayer film may be a film in which a film having another function, such as a protective film, a film that improves temperature characteristics, or the like is laminated to the piezoelectric thin film 6.

Figure 11:
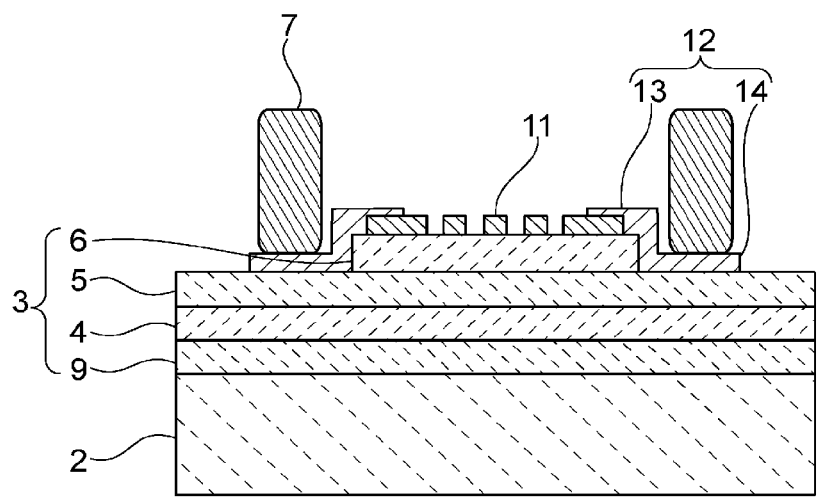
FIG. 11 is an elevational cross-sectional view of an elastic wave device according to another variation of the first preferred embodiment of the present invention.

For example, the bonding material layer 9, which is made of a dielectric film, may be provided below the multilayer film 3, as in the variation in the first preferred embodiment illustrated in FIG. 11, the variation in the second preferred embodiment illustrated in FIG. 12, or the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An elastic wave device comprising:
a support substrate;
a multilayer film located on the support substrate and including a piezoelectric thin film;
an interdigital transducer electrode provided on a surface of the piezoelectric thin film;
a wiring electrode including a lead electrode portion that is located on the multilayer film and is electrically connected to the interdigital transducer electrode, and a pad electrode portion that is continuous with the lead electrode portion;
a support frame that encloses a region where the interdigital transducer electrode is provided;
a cover located on the support frame;
an under-bump metal layer that is connected to the pad electrode portion and passes through the support frame and the cover; and
an external connection terminal connected to the under-bump metal layer; wherein
at least the piezoelectric thin film of the multilayer film is not present below the pad electrode portion and the support frame.

2. The elastic wave device according to claim 1, wherein the multilayer film is substantially not provided between the pad electrode portion and the support substrate below the pad electrode portion.

3. The elastic wave device according to claim 2, wherein the pad electrode portion is provided on the support substrate so that a lower surface of the pad electrode portion is located within a recess provided in an upper surface of the support substrate.

4. The elastic wave device according to claim 1, wherein the piezoelectric thin film is a piezoelectric single-crystal thin film.

5. The elastic wave device according to claim 4, wherein Fe is included in the piezoelectric thin film.

6. The elastic wave device according to claim 1, wherein the multilayer film includes a low acoustic velocity film that contacts with a lower surface of the piezoelectric thin film and that has a lower acoustic velocity of a bulk wave propagating therein than the acoustic velocity of a bulk wave propagating in the piezoelectric thin film, and a high acoustic velocity film that is laminated to a lower surface of the low acoustic velocity film and that has a higher acoustic velocity of a bulk wave propagating therein than the acoustic velocity of an elastic wave propagating in the piezoelectric thin film.

7. The elastic wave device according to claim 6, wherein at least a portion of a layer in a multilayer body including the high acoustic velocity film and the low acoustic velocity film is provided between the pad electrode portion and the support substrate.

8. The elastic wave device according to claim 1, further comprising:
a low acoustic velocity film that contacts with a lower surface of the piezoelectric thin film and that has a lower acoustic velocity of a bulk wave propagating therein than the acoustic velocity of a bulk wave propagating in the piezoelectric thin film; wherein
the support substrate is a high acoustic velocity support substrate that is laminated to a lower surface of the low acoustic velocity film and that has a higher acoustic velocity of a bulk wave propagating therein than the acoustic velocity of an elastic wave propagating in the piezoelectric thin film.

9. The elastic wave device according to claim 1, wherein the external connection terminal includes a metal bump.

10. The elastic wave device according to claim 1, wherein the lead electrode portion of the wiring electrode is continuous with the pad electrode portion, spanning from an upper surface of the multilayer film and along a side surface of the multilayer film, and the side surface of the multilayer film where the lead electrode portion is located is slanted relative to the upper surface of the support substrate so as to be located closer to the interdigital transducer electrode as the side surface progresses upward.

11. The elastic wave device according to claim 10, wherein a step portion is provided in the side surface of the multilayer film where the lead electrode portion is provided.

12. The elastic wave device according to claim 1, wherein a plurality of interdigital transducer electrodes are provided as the interdigital transducer electrode, adjacent ones of the plurality of interdigital transducer electrodes are electrically connected, and the elastic wave device further comprises a connecting wire provided on at least a portion of a layer of the multilayer film.

13. The elastic wave device according to claim 12, wherein the connecting wire is provided so that at least the piezoelectric thin film of the multilayer film is not present below the connecting wire.

14. The elastic wave device according to claim 12, wherein a structure between the pad electrode portion and the support substrate is different from a structure between the connecting wire and the support substrate.

15. The elastic wave device according to claim 1, wherein
the support frame is laminated directly or indirectly onto the support substrate and includes an opening that opens upward;
the cover closes the opening in the support frame;
the under-bump metal layer is bonded to an upper surface of the pad electrode portion; and
the external connection terminal includes a metal bump that is bonded onto the under-bump metal layer.

16. The elastic wave device according to claim 15, wherein the multilayer film is not present below the support frame.

17. The elastic wave device according to claim 15, further comprising a partition wall that contacts with at least a portion of a layer in the multilayer film and the cover.

18. An elastic wave device, wherein the elastic wave device according to claim 1 is an upper surface-side elastic wave device provided on an upper surface side of the support substrate;
a lower surface-side elastic wave device is provided on a lower surface side of the support substrate; and
a connecting electrode that electrically connects the upper surface-side elastic wave device and the lower surface-side elastic wave device is provided in the support substrate.

19. The elastic wave device according to claim 18, wherein the connecting electrode is a via hole electrode that passes through the support substrate.

20. A method of manufacturing the elastic wave device according to claim 1, the method comprising:
forming the multilayer film including the piezoelectric thin film on the support substrate;
forming the interdigital transducer electrode on the surface of the piezoelectric thin film;
forming the wiring electrode including the lead electrode portion electrically connected to the interdigital transducer electrode and the pad electrode portion; and
forming the external connection terminal so as to be electrically connected to the under-bump metal layer; wherein
in the step of forming the multilayer film, in the formation of the piezoelectric thin film, the piezoelectric thin film is patterned after the piezoelectric thin film is formed.

21. The method according to claim 20, wherein the piezoelectric thin film is patterned through etching.

* * * * *